United States Patent [19]
Choi

[11] Patent Number: 6,054,357
[45] Date of Patent: *Apr. 25, 2000

[54] SEMICONDUCTOR DEVICE AND METHOD FOR FABRICATING THE SAME

[75] Inventor: Deuk Sung Choi, Ichon, Rep. of Korea

[73] Assignee: Hyundai Electronics Industries Co., Ltd., Ichon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/948,259

[22] Filed: Oct. 9, 1997

[30] Foreign Application Priority Data

Dec. 20, 1996 [KR] Rep. of Korea ................. 96-68899

[51] Int. Cl.$^7$ .................................................. H01L 21/425
[52] U.S. Cl. ..................... 438/306; 438/373; 438/515; 257/411; 257/405
[58] Field of Search ..................... 257/411, 410, 257/405, 344, 346, 413; 438/373, 302, 306, 525, 528, 515

[56] References Cited

U.S. PATENT DOCUMENTS

| | | | |
|---|---|---|---|
| 5,345,104 | 9/1994 | Prall et al. | 257/607 |
| 5,552,332 | 9/1996 | Tseng et al. | 437/41 |
| 5,672,525 | 9/1997 | Pan | 437/40 |
| 5,714,788 | 2/1998 | Ngaoaram | 257/411 |
| 5,814,863 | 9/1998 | Pan | 257/346 |

FOREIGN PATENT DOCUMENTS

| | | | |
|---|---|---|---|
| 1296670 | 11/1989 | Japan | 438/306 |
| 5-267654 | 10/1993 | Japan | 438/306 |
| 5-283679 | 10/1993 | Japan | 438/306 |
| 6-283713 | 10/1994 | Japan | 438/306 |

*Primary Examiner*—Donald L. Monin, Jr.
*Attorney, Agent, or Firm*—Jacobson, Price, Holman & Stern, PLLC

[57] ABSTRACT

A semiconductor device having a structure including no LDD region while being structured in such a manner that fixed charges are charged in portions of a gate oxide film overlapping with side walls of a gate electrode formed on the gate oxide film so as to reduce the intensity of electric field between the source and drain of a transistor included in the semiconductor device. The charged-up positive or negative fixed charges serve to invert the conductivity of the channel region portion of a semiconductor substrate on which the gate oxide film is formed, thereby providing the same effect as the LDD region. The invention also provides a method for fabricating the semiconductor device.

6 Claims, 5 Drawing Sheets

SEMICONDUCTOR DEVICE AND METHOD FOR FABRICATING THE SAME

BACKGROUND OF THE INVENTION

1. Field of the Invention

The present invention relates to a semiconductor device and a method for fabricating the same, and more particularly to a highly integrated semiconductor device exhibiting improved leakage current characteristics and reliability without using a separate lightly doped drain (LDD) structure and a method for fabricating such a highly integrated semiconductor device.

2. Description of the Prior Art

The recent trend to produce highly integrated semiconductor devices results in a reduced channel length of a single transistor in order to increase the performance and integration of semiconductor devices using the transistor.

However, where a transistor has a reduced channel length, the intensity of electric field at the drain of the transistor increases, so that a semiconductor device using the transistor exhibits a degradation in its off-state characteristic and reliability.

A number of research efforts have been made to solve the above-mentioned problems. The commonly used method is to form spacer oxide films on side walls of a gate electrode formed on a semiconductor substrate, thereby forming an LDD region for providing a gradual concentration distribution of impurity ions in a channel direction in the semiconductor substrate in order to achieve a reduction in the intensity of electric field.

Now, this method, which forms a transistor having an LDD structure, will be described in conjunction with FIGS. 1 and 2.

In accordance with the conventional method, a gate oxide film 2 is first formed over a semiconductor substrate 1, as shown in FIG. 1. A gate electrode 3 is then formed on the gate oxide film 2.

Using the gate electrode 3 as a mask, impurity ions having a conductivity different from that of the semiconductor substrate 1 are implanted in a low concentration in the semiconductor substrate 1. The resulting structure is annealed to form an LDD region 4 in the semiconductor substrate 1.

An oxide film (not shown) is then deposited over the entire exposed surface of the resulting structure, as shown in FIG. 2. The oxide film is anisotropically etched, thereby forming spacer oxide films 5 on the side walls of the gate electrode 3, respectively.

Thereafter, impurity ions having a conductivity different from the semiconductor substrate 1 is implanted in a high concentration in the semiconductor substrate 1. The resulting structure is then annealed, thereby forming source/drain regions 6.

However, the above-mentioned method has various problems.

For example, in the conventional method, it is required to respectively optimize the ON and OFF characteristics of the semiconductor device because a degradation in the ON-state characteristic is exhibited in proportion to a reduction in the intensity of electric field obtained by the LDD region.

To this end, it is essentially required to optimize the dose of the low concentration impurity ions and the width of the spacers.

In particular, the width of the spacers should be more precisely adjusted because it exhibits considerable influence on a variation in the characteristics of the semiconductor device when the semiconductor device has a reduced channel length. However, it is difficult to obtain a desired process margin due to limited process conditions such as a limited thickness of the spacer oxide film, a limited thickness of the gate electrode, a fine adjustment required in the anisotropic etching to form spacers and damage of the spacer oxide film caused by plasma.

SUMMARY OF THE INVENTION

Therefore, an object of the invention is to solve the above-mentioned problems involved in the prior art and to provide a semiconductor device having a structure including no LDD region while being structured in such a manner that fixed charges are charged in a gate oxide film so as to obtain the same effect as the LDD region, and a method for fabricating the semiconductor device.

Another object of the invention is to provide a semiconductor device in which a gentle concentration gradient effect is exhibited in a channel direction of junction dopant, thereby obtaining a reduction in the intensity of electric field resulting in an improvement in the reliability and OFF-state leakage current characteristics of the semiconductor device, and a method for fabricating the semiconductor device.

In accordance with first aspect, the present invention provides a semiconductor device comprising: a semiconductor substrate; an element isolating film formed on the semiconductor substrate; a gate oxide film formed on the semiconductor substrate and charged with fixed charges; a gate electrode formed on the gate oxide film; and source/drain regions respectively formed in the semiconductor substrate in opposite sides of the gate electrode.

In accordance with second aspect, the present invention provides a semiconductor device comprising: a semiconductor substrate having a first-conductivity type well and a second-conductivity type well, wherein the semiconductor substrate also having an element isolating film at a boundary between the wells; gate oxide films respectively formed on the first and second-conductivity type wells of the semiconductor substrate and charged with first fixed charges and second fixed charges; gate electrodes respectively formed on the gate oxide films; first-conductivity type source/drain regions respectively formed in the first-conductivity type well in opposite sides of the gate electrode formed on the first-conductivity type well; and second-conductivity type source/drain regions respectively formed in the second-conductivity type well in opposite sides of the gate electrode formed on the second-conductivity type well.

In accordance with third aspect, the present invention provides a method for fabricating a semiconductor device, comprising the steps of: providing a semiconductor substrate having a first conductivity; forming an element isolating film on the first-conductivity type semiconductor substrate, thereby defining an active region and a field region; sequentially forming a gate oxide film and a gate electrode on a portion of the semiconductor substrate corresponding to the active region; implanting impurity ions having a second conductivity in the semiconductor substrate in opposite sides of the gate electrode, thereby forming source/drain regions; charging fixed charges in the gate oxide film; and annealing the gate oxide film charged with the fixed charges, thereby laterally and downwardly diffusing the charged-up fixed charges in the gate oxide film in such a manner that the diffused charges overlap partially with the gate electrode.

In accordance with fourth aspect, the present invention provides a method for fabricating a semiconductor device, comprising the steps of: providing a semiconductor substrate having a first conductivity; forming an element isolating film on the first-conductivity type semiconductor substrate, thereby defining an active region and a field region; sequentially forming a gate oxide film and a gate electrode on a portion of the semiconductor substrate corresponding to the active region; charging fixed charges in the gate oxide film in opposite sides of the gate electrode; and annealing the gate oxide film charged with the fixed charges, thereby laterally and downwardly diffusing the charged-up fixed charges in the gate oxide film in such a manner that the diffused charges overlap partially with the gate electrode, and implanting impurity ions having a second conductivity in the semiconductor substrate in opposite sides of the gate electrode, thereby forming source/drain regions;

In accordance with fifth aspect, the present invention provides a method for fabricating a semiconductor device, comprising the steps of: providing a semiconductor substrate having a first-conductivity type well, a second-conductivity type well and an element isolating film at a boundary between the wells; sequentially forming gate oxide films and gate electrodes on the first and second-conductivity type wells of the semiconductor substrate, respectively; implanting second-conductivity type impurity ions in the first-conductivity type well in opposite sides of the gate electrode formed on the first-conductivity type well, thereby forming second-conductivity type source/drain regions; charging first fixed charges in the gate oxide film formed on the first-conductivity type well; annealing the gate oxide film charged with the first fixed charges, thereby laterally and downwardly diffusing the charged-up first fixed charges in the associated gate oxide film in such a manner that the diffused charges overlap partially with the associated gate electrode; implanting first-conductivity type impurity ions in the second-conductivity type well in opposite sides of the gate electrode formed on the second-conductivity type well, thereby forming first-conductivity type source/drain regions; charging second fixed charges in the gate oxide film formed on the second-conductivity type well; and annealing the gate oxide film charged with the second fixed charges, thereby laterally and downwardly diffusing the charged-up second fixed charges in the associated gate oxide film in such a manner that the diffused charges overlap partially with the associated gate electrode.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
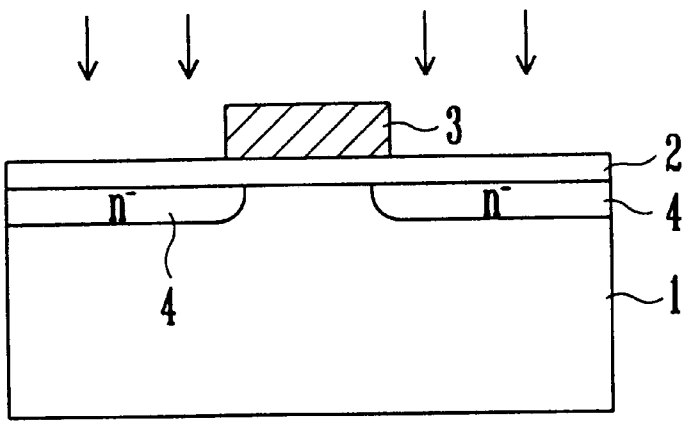
FIGS. 1 and 2 are sectional views respectively illustrating a conventional method for fabricating a semiconductor device having an LDD structure.
Figure 2:
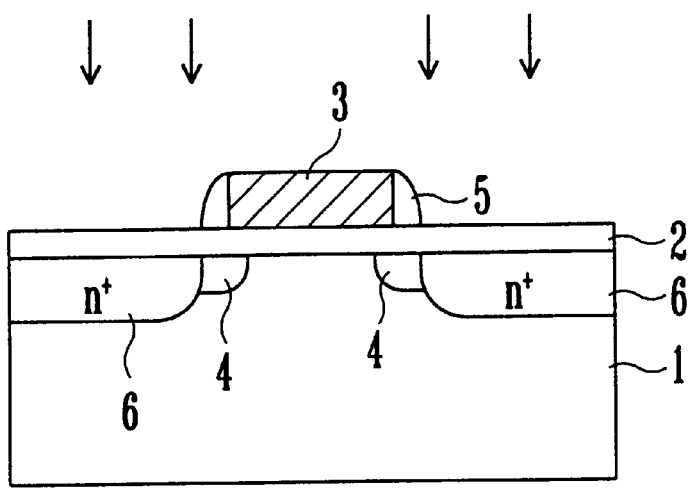
Figure 3:
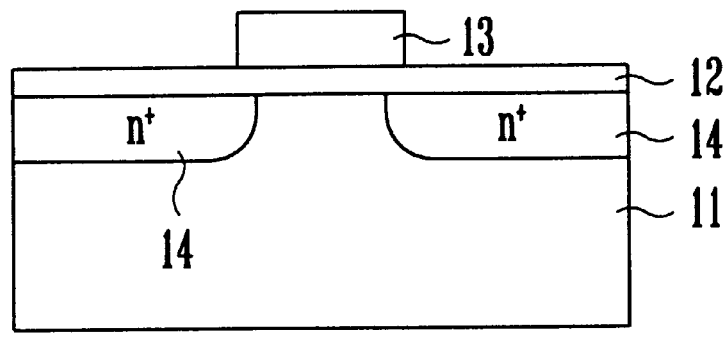
FIGS. 3 and 4 are sectional views respectively illustrating a method for fabricating a semiconductor device in accordance with a first embodiment of the present invention.
Figure 4:
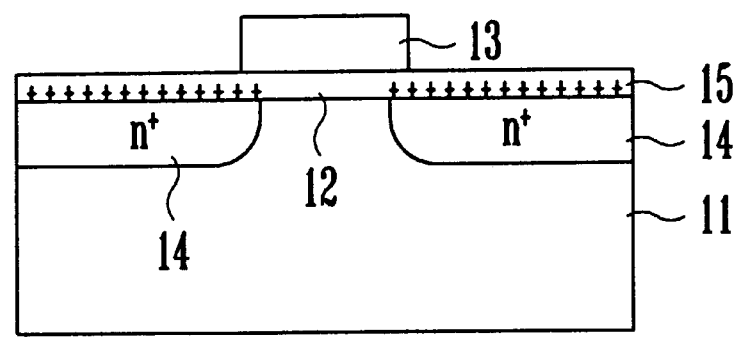

FIGS. 3 and 4 illustrate a method for fabricating a semiconductor device in accordance with a first embodiment of the present invention.

In accordance with this method, a gate oxide film 12 is first formed over a semiconductor substrate 11 which has a P-type conductivity or a P-well, as shown in FIG. 3. Thereafter, a gate conductive layer is deposited over the gate oxide film 12 and then patterned to form a gate electrode 13 on the gate oxide film 12 in accordance with a patterning process.

The semiconductor substrate 11 is then implanted with n-type impurity ions in a high concentration, thereby forming a source/drain 14 in the semiconductor substrate 11.

Subsequently, positive fixed charges are charged in the gate oxide film 12 using plasma containing hydrogen and nitrogen, for example, plasma containing ammonia ($NH_3$) or implant containing hydrogen or nitrogen. The resulting structure is then annealed to laterally diffuse the charged-up positive fixed charges in such a manner that the diffused charges overlap partially with the gate electrode 13.

The mechanism, in which positive fixed charges are produced, is known as a mechanical stress of nitrogen or a substitution of hydrogen.

The charged-up positive fixed charges serve to invert the conductivity of the channel region portion of the p-type semiconductor substrate, thereby forming an $n^-$ region. This $n^-$ region provides the same effect as an LDD region.

That is, a gentle concentration gradient effect is exhibited in a channel direction of junction dopant, thereby reducing the intensity of electric field. By virtue of such a reduction in the intensity of electric field, the finally produced semiconductor device has improved reliability and OFF-state leakage current characteristics.

Alternatively, it is possible to carry out the step of charging positive fixed charges before the step of forming the source/drain.

A semiconductor device fabrication method according to a second embodiment of the present invention will now be described in conjunction with FIGS. 5 and 6.

Figure 5:
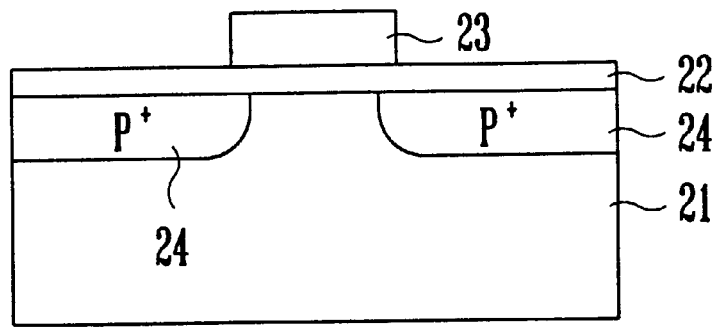
FIGS. 5 and 6 are sectional views respectively illustrating a method for fabricating a semiconductor device in accordance with a second embodiment of the present invention.
Figure 6:
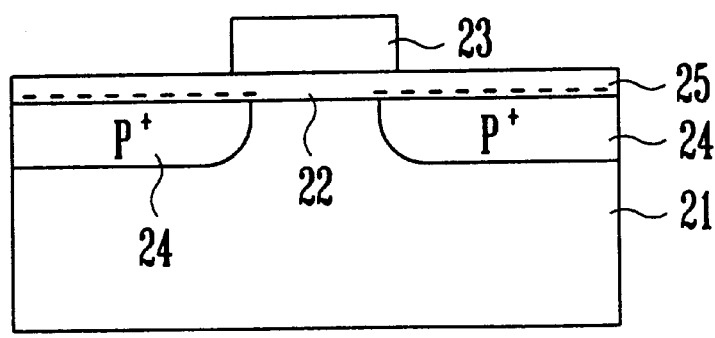

FIGS. 5 and 6 are sectional views respectively illustrating the semiconductor device fabrication method according to the second embodiment of the present invention.

In accordance with this method, a gate oxide film 22 is first formed over a semiconductor substrate 21 which has an N-type conductivity or an N-well, as shown in FIG. 5. Thereafter, a gate conductive layer is deposited over the gate oxide film 22 and then patterned to form a gate electrode 23 on the gate oxide film 22 in accordance with a patterning process.

The semiconductor substrate 21 is then implanted with p-type impurity ions in a high concentration, thereby forming a source/drain 24 in the semiconductor substrate 21.

Subsequently, negative fixed charges are charged in the gate oxide film 22 using plasma or implant containing fluorine. The resulting structure is then annealed to laterally and downwardly diffuse the charged-up positive fixed charges in the gate oxide film 22.

The charged-up positive fixed charges serve to invert the conductivity of the channel region portion of the n-type semiconductor substrate, thereby forming a $p^-$ region. This p region provides the same effect as an LDD region.

That is, a gentle concentration gradient effect is exhibited in a channel direction of junction dopant, thereby reducing the intensity of electric field. By virtue of such a reduction in the intensity of electric field, the finally produced semiconductor device has improved reliability and OFF-state leakage current characteristics.

Alternatively, it is possible to carry out the step of charging negative fixed charges before the step of forming the source/drain. Now, a semiconductor device fabrication method according to a third embodiment of the present invention will be described in conjunction with FIGS. 7 to 10.

FIGS. 7 to 10 are sectional views respectively illustrating the semiconductor device fabrication method according to the third embodiment of the present invention.

Figure 7:
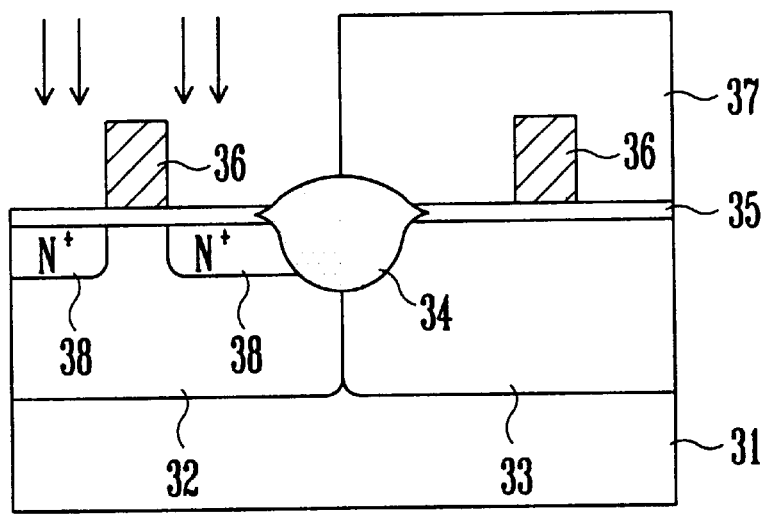
FIGS. 7 to 10 are sectional views respectively illustrating a method for fabricating a semiconductor device having n and p-type transistors adjacent to a semiconductor substrate in accordance with a third embodiment of the present invention.

In accordance with this method, a P-well 32 and an N-well 33 are first formed in a semiconductor substrate 31. An element isolating film 34 is also formed on the semiconductor substrate 31 at the boundary of the P and N-wells 32 and 33, as shown in FIG. 7.

Gate oxide films 35 are then formed over the semiconductor substrate 31. A gate electrode 36 is also formed on each gate oxide film 35. A photoresist film pattern 37 is then formed over the N-well 33. By the photoresist film pattern 37, only one of the gate oxide films 35 is exposed.

Thereafter, n-type impurity ions are implanted in a high concentration in the P-well 32 of the semiconductor substrate 31, thereby forming a source/drain 38 in the semiconductor substrate 31.

Figure 8:
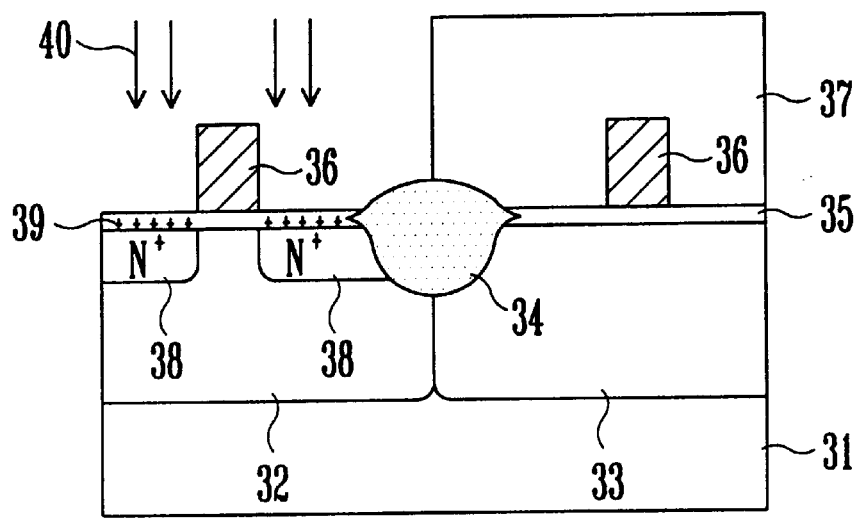

Subsequently, positive fixed charges are charged in the exposed gate oxide film 35 using plasma 40 containing hydrogen and nitrogen, for example, plasma containing ammonia ($NH_3$) or implant 40 containing hydrogen or nitrogen, as shown in FIG. 8. The resulting structure is then annealed to laterally diffuse the charged-up positive fixed charges, thereby forming a positive fixed charge region 39 overlapping partially with the exposed gate electrode 36.

Figure 9:
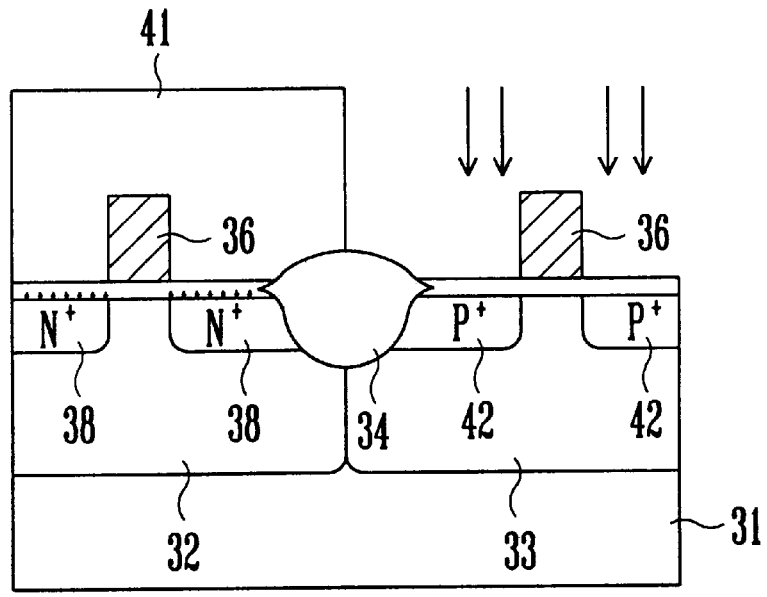
Figure 10:
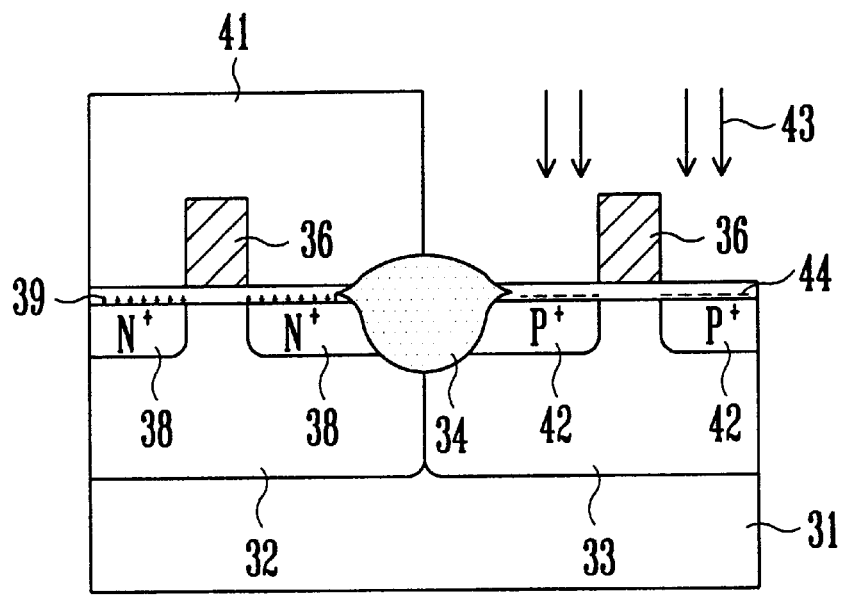

The photoresist film pattern 37 on the N-well 33 is then removed, as shown in FIG. 9. In this state, a photoresist film pattern 41 is formed on the P-well 32. Subsequently, p-type impurity ions are implanted in a high concentration in the exposed N-well 33. The resulting structure is then annealed, thereby forming a source/drain 42 in the semiconductor substrate 31. Negative fixed charges are then charged in the exposed gate oxide film 35 using plasma or implant 43 containing fluorine. The resulting structure is then annealed to laterally and downwardly diffuse the charged-up positive fixed charges in the gate oxide film 35, thereby forming a negative fixed charge region 44 overlapping partially with the exposed gate electrode 36, as shown in FIG. 10. The charged-up positive or negative fixed charges serve to invert the conductivity of the associated channel region portion of the semiconductor substrate, thereby providing the same effect as that of an LDD region.

That is, a gentle concentration gradient effect is exhibited in a channel direction of junction dopant, thereby reducing the intensity of electric field. By virtue of such a reduction in the intensity of electric field, the finally produced semiconductor device has improved reliability and OFF-state leakage current characteristics.

Alternatively, it is possible to carry out the steps of charging positive and negative fixed charges before the steps of forming the source/drains of the NMOS and PMOS structures.

As apparent from the above description, the present invention provides various effects.

For example, since positive or negative fixed charges are charged in the gate oxide film beneath the gate electrode in accordance with the present invention, the channel region portion of the semiconductor substrate has an inverted conductivity. Accordingly, the same effect as the LDD region is obtained.

By virtue of such an effect, a reduction in the intensity of electric field is obtained. As a result, the finally produced semiconductor device has improved reliability and OFF-state leakage current characteristics. Since a junction, which is electrically identical to the LDD region, is formed, there is no lattice defect. It is also possible to almost completely remove defects from even the portion of the semiconductor device where a maximum variation in the intensity of electric field is exhibited. Accordingly, an improvement in leakage current characteristics is obtained.

In addition, it is unnecessary to form spacers on the side walls of the gate electrode. Accordingly, it is possible to simplify the whole process while obtaining an improvement in the characteristics of the gate oxide film.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:

providing a semiconductor substrate having a first-conductivity type well, a second-conductivity type well and an element isolating film at a boundary between the wells;

sequentially forming gate oxide films and gate electrodes on the first and second-conductivity type wells of the semiconductor substrate, respectively;

implanting second-conductivity type impurity ions in the first-conductivity type well in opposite sides of the gate electrode formed on the first-conductivity type well, thereby forming second-conductivity type source/drain regions;

charging first fixed charges in the gate oxide film formed on the first-conductivity type well;

annealing the gate oxide film charged with the first fixed charges, thereby laterally and downwardly diffusing the charged-up first fixed charges in the associated gate oxide film in such a manner that the diffused charges overlap partially with the associated gate electrode;

implanting first-conductivity type impurity ions in the second-conductivity type well in opposite sides of the gate electrode formed on the second-conductivity type well, thereby forming first-conductivity type source/drain regions;

charging second fixed charges in the gate oxide film formed on the second-conductivity type well; and annealing the gate oxide film charged with the second fixed charges, thereby laterally and downwardly diffusing the charged-up second fixed charges in the associated gate oxide film in such a manner that the diffused charges overlap partially with the associated gate electrode.

2. The method in accordance with claim 1, wherein the first fixed charges are positive where the second conductivity type is an N type.

3. The method in accordance with claim 2, wherein the positive fixed charges are charged by plasma or implant containing hydrogen or nitrogen.

4. The method in accordance with claim 1, wherein the fixed charges are negative where the second conductivity type is a P type.

5. The method in accordance with claim 4, wherein the negative fixed charges are charged by plasma or implant containing fluorine.

6. The method in accordance with claim 1, wherein the steps of charging the first and second fixed charges are carried out before the steps of forming the first and second-conductivity type source/drains.

* * * * *